(12) United States Patent
Kim et al.

(10) Patent No.: US 10,473,725 B2
(45) Date of Patent: Nov. 12, 2019

(54) METHOD AND SYSTEM FOR CALCULATING LOW VOLTAGE EXPRESSION LEVEL OF A SECONDARY BATTERY

(71) Applicant: LG CHEM, LTD., Seoul (KR)

(72) Inventors: So Hee Kim, Daejeon (KR); Nak Gi Sung, Daejeon (KR); Joon Sung Bae, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/366,172

(22) Filed: Mar. 27, 2019

(65) Prior Publication Data

US 2019/0302189 A1   Oct. 3, 2019

(30) Foreign Application Priority Data

Apr. 3, 2018   (KR) .......................... 10-2018-0038544

(51) Int. Cl.
| | |
|---|---|
| *G01R 31/3835* | (2019.01) |
| *H01M 10/42* | (2006.01) |
| *G01R 31/36* | (2019.01) |
| *H01M 10/48* | (2006.01) |
| *H01M 10/44* | (2006.01) |
| *G01R 31/392* | (2019.01) |

(52) U.S. Cl.
CPC ..... *G01R 31/3835* (2019.01); *G01R 31/3648* (2013.01); *G01R 31/392* (2019.01); *H01M 10/4228* (2013.01); *H01M 10/441* (2013.01); *H01M 10/482* (2013.01)

(58) Field of Classification Search
CPC .............. G01R 31/3835; G01R 31/392; G01R 31/3648; H01M 10/441; H01M 10/4228; H01M 10/482
USPC ......................................... 324/434, 426, 425
See application file for complete search history.

(56) References Cited

U.S. PATENT DOCUMENTS

| | | | |
|---|---|---|---|
| 2005/0118497 A1* | 6/2005 | Breen ...................... H01M 2/34 |
| | | | 429/93 |
| 2005/0242820 A1* | 11/2005 | Kume ............... H01M 10/4285 |
| | | | 324/426 |
| 2013/0141107 A1* | 6/2013 | Yuasa .................. G01R 31/382 |
| | | | 324/426 |
| 2014/0028320 A1 | 1/2014 | Nakamura | |

FOREIGN PATENT DOCUMENTS

| | | | | |
|---|---|---|---|---|
| JP | 2001-76763 A | 3/2001 | | |
| JP | 2001228224 A | * 8/2001 | ............ H01M 10/40 |
| JP | 2004-132776 A | 4/2004 | | |
| JP | 4048905 B2 | 2/2008 | | |
| JP | 2008-98075 A | 4/2008 | | |
| JP | 2011069775 A | * 4/2011 | ............ H01M 10/48 |
| JP | 5464119 B2 | 4/2014 | | |
| JP | 2014-223003 A | 11/2014 | | |
| JP | 5692183 B2 | 4/2015 | | |

(Continued)

*Primary Examiner* — Giovanni Astacio-Oquendo
(74) *Attorney, Agent, or Firm* — Birch, Stewart, Kolasch & Birch, LLP

(57) ABSTRACT

A method for calculating a leakage current of a precipitate by using a voltage drop amount result measured in an aging process according to a discharge voltage of a normal cell and a profile according to a discharge voltage of a normal cell and directly presenting a low voltage expression level based thereon.

9 Claims, 5 Drawing Sheets

(56) References Cited

FOREIGN PATENT DOCUMENTS

| | | | | |
|---|---|---|---|---|
| JP | 5753764 | B2 | 7/2015 | |
| JP | 2016090399 | A * | 5/2016 | ............ H01M 10/48 |
| KR | 10-2000-0060169 | A | 10/2000 | |
| KR | 20120123346 | A * | 11/2012 | ............ H01M 10/42 |
| KR | 10-1520175 | B1 | 5/2015 | |
| KR | 10-2015-0063254 | A | 6/2015 | |
| KR | 10-2015-0144558 | A | 12/2015 | |
| KR | 10-2016-0024980 | A | 3/2016 | |
| KR | 10-1725498 | B1 | 4/2017 | |
| KR | 10-1802002 | B1 | 11/2017 | |

* cited by examiner

[Fig. 1A]
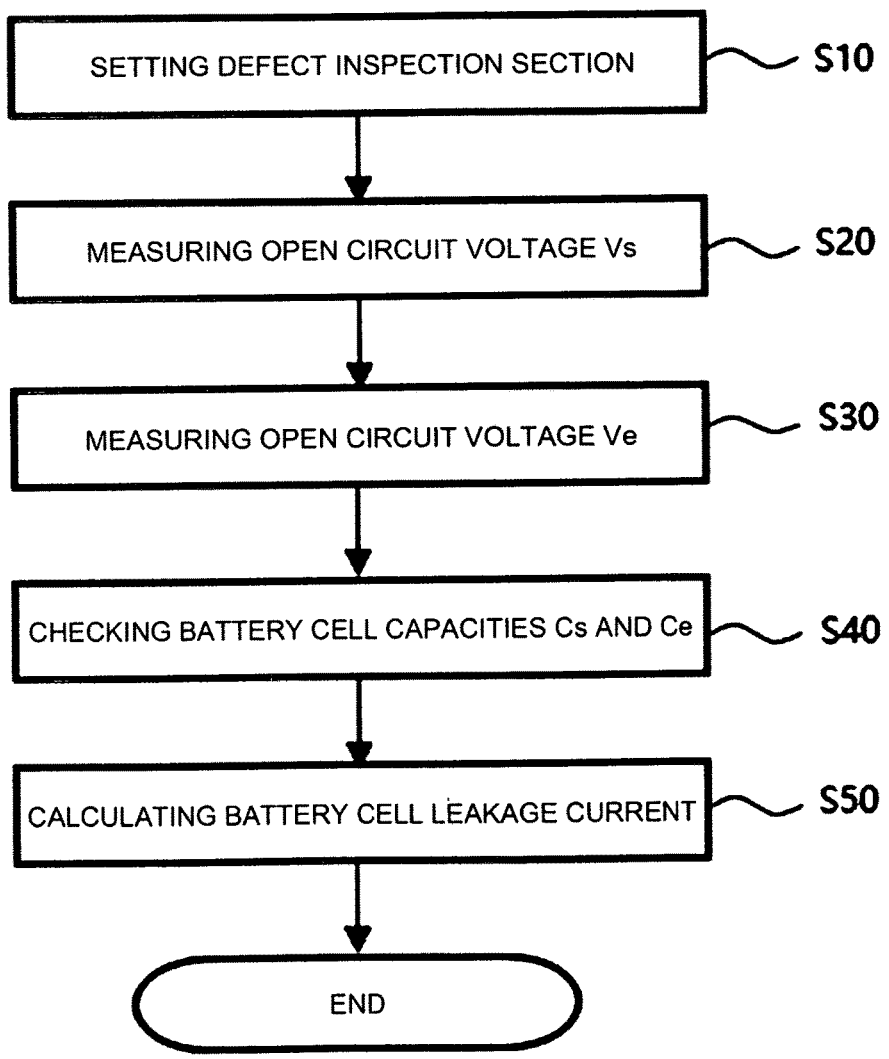

[Fig. 1B]
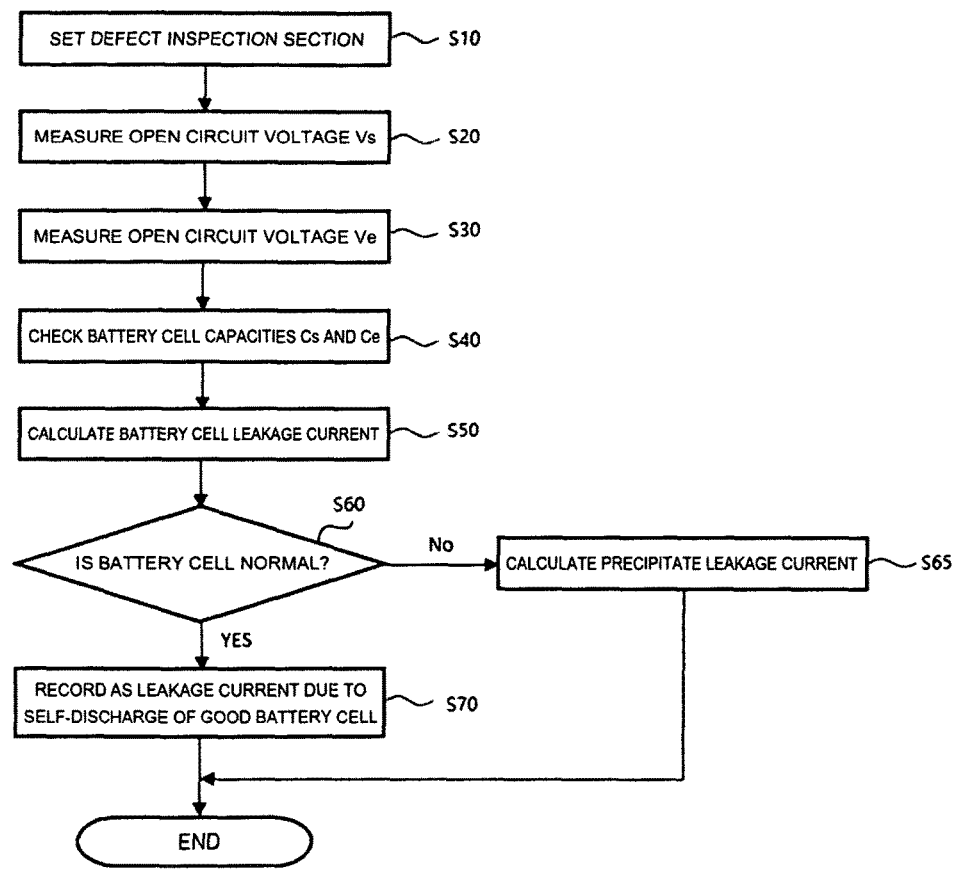

[Fig. 2A]
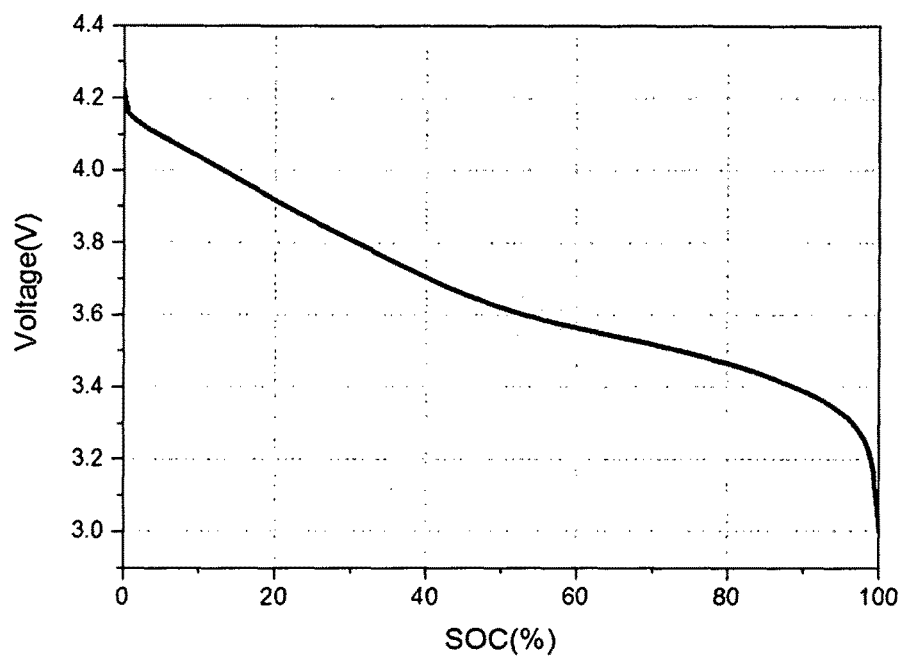

[Fig. 2B]
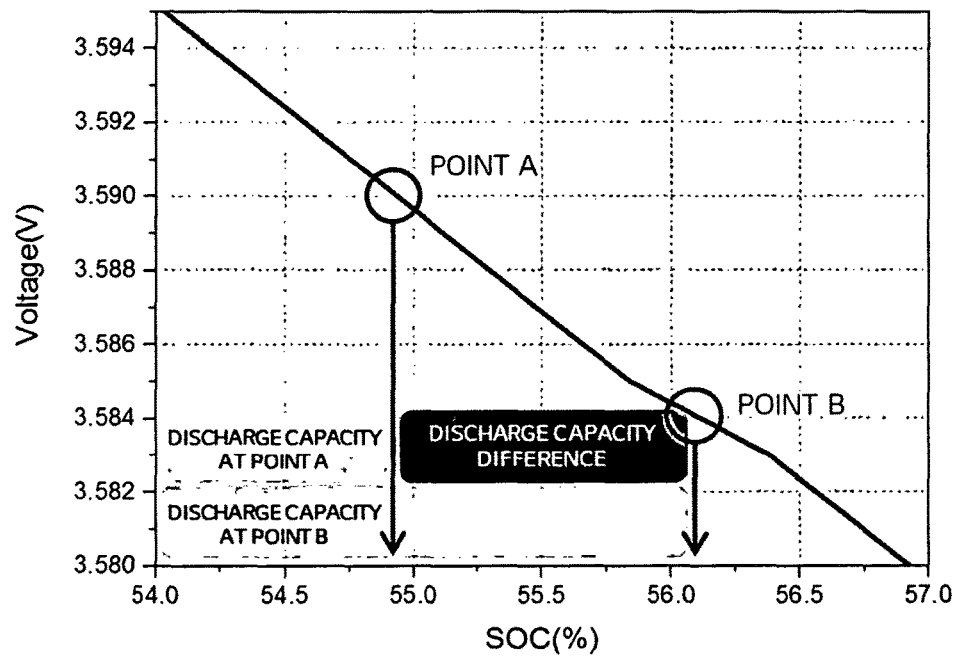

[Fig. 3]
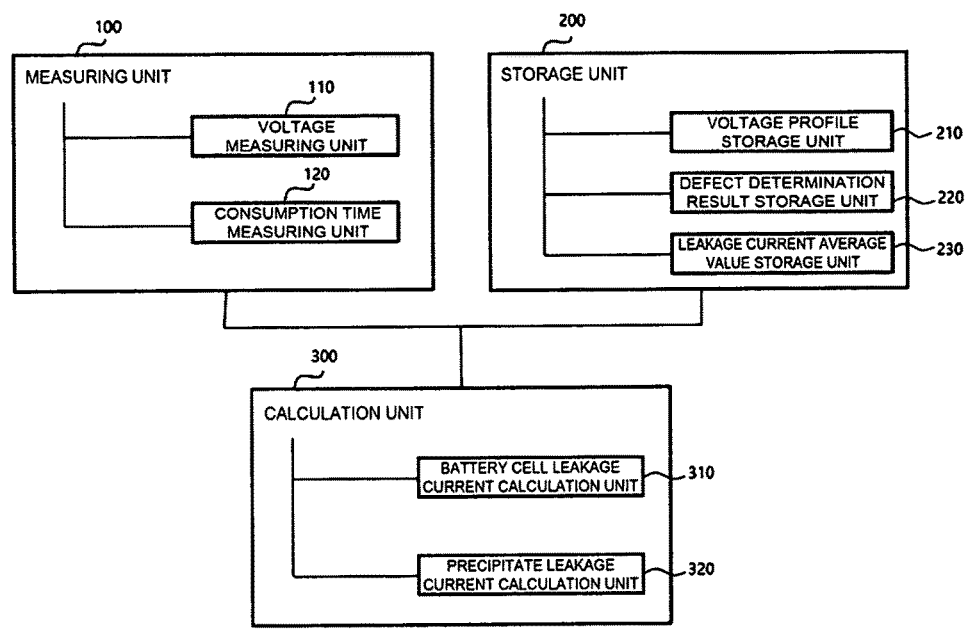

METHOD AND SYSTEM FOR CALCULATING LOW VOLTAGE EXPRESSION LEVEL OF A SECONDARY BATTERY

TECHNICAL FIELD

The present invention relates to a method and system for performing a calculation to check a low voltage expression level for detecting a defect of a secondary battery, and more particularly, to a method and system for calculating a leakage current of a precipitate by using a voltage drop amount result measured in an aging process according to a discharge voltage of a normal cell and a profile according to a discharge voltage of a normal cell and directly presenting a low voltage expression level based thereon.

BACKGROUND ART

As technology development and demand for mobile devices are increasing and the spread of electric vehicles is expanding, demand for secondary batteries as energy sources is rapidly increasing. Among them, demand for lithium secondary batteries having high capacity and energy density is especially high.

Generally, a lithium secondary battery is fabricated by manufacturing an electrode assembly composed of a negative electrode, a positive electrode, and a separator, inserting the electrode assembly into a battery case, and injecting an electrolyte into the electrode assembly. The lithium secondary battery thus produced is required to be activated by a predetermined charge and discharge to function as a battery. Such a process is referred to as a formation process or an activation process. The secondary battery is also shipped after an aging process and a defective product sorting process. The aging process is an aging process in which the electrolyte is allowed to enter the empty space of the electrode to allow time for forming a stable electrolyte channel.

The secondary battery is manufactured so that a positive electrode and a negative electrode are prevented from being contacted by a porous insulating film (separator) to prevent a short circuit. However, insulation may not be properly maintained due to various reasons during the manufacturing process of the battery. As a result, an internal short circuit of the battery can occur. Lithium-ion batteries can be ignited or exploded when a positive electrode and a negative electrode are short-circuited. Even when they are slightly short-circuited, ions move and current flows. This condition is often referred to as a soft short or a micro short.

Soft-shorts generate precipitates, thereby causing low-voltage defects. Soft-short cells tend to take a relatively long time to be expressed as compared to hard-short cells, and their expression time vary considerably depending on the short-circuit state or degree.

In the conventional defect selection process, the difference in the voltage drop between good products and defective products has been utilized. And through the value of the voltage drop measured at this time, the change by the low voltage expression steps and the effects according thereto would have been presented. However, this method cannot quantitatively analyze the actual low-voltage expression level, so it is impossible to quantitatively classify the degree of failure of defective cells for efficient process improvement, and the level of low-voltage expression of defective cells cannot be represented as a single measure.

Therefore, it would be easy to identify defective battery cells according to the degree of the voltage drop if the low voltage level is quantitatively indicated and used as the leakage current, which is a factor related to the precipitate that directly induces the low voltage defect, and quantitative feedback for improvement of the battery cell manufacturing process would be possible.

DISCLOSURE

Technical Problem

It is an object of the present invention to provide a calculation method and system capable of improving a problem of a conventional process which uses a voltage drop difference, etc. in order to present a low voltage expression level, presenting a low voltage expression level and calculation method of a new scheme by using a leakage current of a battery cell, and calculating a quantitative numerical value for effective improvement of the process based thereon.

Technical Solution

In order to achieve the above object, the inventors of the present application have studied from various aspects and completed the present invention based on a leakage current factor capable of direct and quantitative indication on precipitates which cause a low voltage defect unlike a conventional method of presenting a low voltage level using a voltage difference.

To achieve these and other advantages and in accordance with the purpose of the present invention, as embodied and broadly described herein, there is provided a method for detecting a secondary battery low voltage defect expression level in a battery cell defect inspection process of a secondary battery, including:
  (a) setting a defect inspection section in an aging process of the battery cell;
  (b) measuring an open circuit voltage (OCV) Vs of the battery cell at a start of the defect inspection section;
  (c) measuring an open circuit voltage (OCV) Ve of the battery cell at an end of the defect inspection section;
  (d) confirming battery cell capacities Cs and Ce at the Vs and Ve by using a discharge voltage profile of a normal cell; and
  (e) calculating a leakage current by using time required for the defect inspection section and a capacity change value Cd between Cs and Ce.

The aging process of step (a) may be a shipment aging process.

In the step (d), the discharge voltage profile of the normal cell is required. In order to calculate the leakage current calculation value more accurately, it is preferable to use the full discharge voltage profile during the activation process of the normal cell.

On the other hand, the capacity change value Cd of the battery cell in the step (e) is derived by following Equation 1:

$$C_d = C_s C_e \qquad \text{<Equation 1>}$$

(where Cd denotes a capacity change value of the battery cell, Cs denotes a battery cell capacity when equal to Vs in the step (b) in the discharge voltage profile of the normal cell, and Ce denotes a battery cell capacity when equal to Ve in the step (c) in the discharge voltage profile of the normal cell.)

The leakage current in the step (e) can be calculated by dividing the change in the capacity of the battery cell by the time required for the defect inspection section. Specifically, the leakage current can be derived by the following Equation 2.

$$I_{leak} = C_d / T \qquad \text{<Equation 2>}$$

(where $I_{leak}$ represents the leakage current of the battery cell, $C_d$ represents the capacity change value of the battery cell, and T represents the time required for the defect inspection section.)

The $I_{leak}$ value is calculated as a leakage current value due to self-discharge of the non-defective battery cell when the subject battery cell is a normal cell. On the other hand, when the subject battery cell is a defective cell in which a low voltage is expressed, the $I_{leak}$ value becomes a sum of a leakage current due to self-discharge and a leakage current due to an internal short circuit.

Therefore, depending on whether the subject battery cell is a normal cell or a defective cell, the additional step is performed to calculate the leakage current due to the self-discharge and the internal short-circuit leakage current due to the precipitate.

If the subject battery cell is determined to be defective, it may further include the step of calculating a precipitate leakage current according to Equation 3. In this case, unlike the conventional method, it is possible to quantitatively analyze the precipitation and the degree of the defect.

The leakage current of a precipitate=the leakage current of a battery cell determined to be defective–the average leakage current of a normal cell <Equation 3>

If the subject battery cell is a normal cell, it may further include recording $I_{leak}$ value, which is a leakage current calculated in the step (e), as leakage current due to self-discharge of the non-defective battery cell.

In order to achieve the above object, there is provided a system for detecting a low voltage level of the present invention, including: a measuring unit, a storage unit, and a calculation unit, wherein the measuring unit includes a voltage measuring unit of a battery cell and a consumption time measuring unit of a defect inspection section, wherein the storage unit includes a voltage value storage unit of the battery cell, a discharge voltage profile storage unit of a normal cell, a defect determination result storage unit, and a leakage current average value storage unit of the normal cell, and wherein the calculation unit includes a leakage current calculation unit of a battery cell and a precipitate leakage current calculation unit.

Herein, the defect determination result storage unit stores a result of determining whether the battery cell is normal or defective, and an additional step may be determined among a step of recording the leakage current due to the self-discharge of a good product battery cell and a step of calculating the precipitate leakage current of a defective cell.

Advantageous Effects

In view of the above-described problems and circumstances, the present invention can provide a calculation unit for calculating a leakage current caused by a precipitate to directly indicate a low-voltage expression level, and can determine whether a battery cell is defective by comparing with the average leakage current of a normal cell.

In addition, the present invention can calculate leakage currents due to precipitates directly affecting low voltage, thereby enabling efficient process control by classifying according to the degree of defect of the battery cell and can effectively improve the yield of the battery cell manufacturing process through quantitative feedback.

BRIEF DESCRIPTION OF THE DRAWINGS

FIG. 1A is a flowchart showing an example of a preferred process sequence of the method of detecting a low voltage defective expression level of a secondary battery according to the present invention.

FIG. 1B is a flowchart showing another example of a preferred process sequence of the method of detecting a low voltage defective expression level of a secondary battery according to the present invention.

FIG. 2A is a chart showing an example of a full-discharge voltage profile during an activation process of a normal battery cell.

FIG. 2B is an enlarged chart of a portion indicated by gray in the graph of FIG. 2A.

FIG. 3 is a schematic diagram showing a preferred overall configuration of a secondary battery low-voltage defective expression level detection system according to the present invention.

DETAILED DESCRIPTION OF THE PREFERRED EMBODIMENTS

According to the embodiment of the present invention, it is possible to calculate the leakage current in the aging process of the battery cell using the discharge profile of the normal cell, and compare the calculated leakage current with the leakage current of the normal cell to thereby determine whether there is a defect.

According to still another embodiment of the present invention, it is also possible to calculate the leakage current due to the precipitate by subtracting the leakage current value of the normal cell from the leakage current value of the battery cell determined to be defective.

Hereinafter, the present invention will be described more specifically with reference to the accompanying drawings. It is to be understood that the following detailed description and drawings are merely illustrative of the embodiments of the present invention, and therefore the present invention should not be construed as being limited to the description and contents.

Further, it should be understood that the terms "step (a)" and the like are used in the present invention, but these terms are used to distinguish the process steps and the like from each other to facilitate understanding of the present invention, and the scope of the invention should not be construed to be unreasonably reduced by such terms.

The present invention presents a method of calculating a defect expression level of a battery cell in a process of checking a battery cell defect of a secondary battery and can be explained as follows with reference to the flowchart illustrated in FIG. 1A as a specific embodiment: (a) setting a defect inspection section in an aging process of the battery cell; (b) measuring an open circuit voltage (OCV) Vs of the battery cell at a start of the defect inspection section; (c) measuring an open circuit voltage (OCV) Ve of the battery cell at an end of the defect inspection section; (d) confirming battery cell capacities Cs and Ce at the Vs and Ve by using a discharge voltage profile of a normal cell; and (e) calculating a leakage current by using time required for the defect inspection section and Cd which is a changed value of the Cs and Ce.

The aging process may be carried out in an activation process or a shipping process. Specifically, the aging process during the activation process may be performed at a constant temperature and a constant humidity. On the other hand, the formation process that proceeds during the activation process proceeds to secure the stability of the lifetime of the secondary battery, and the secondary battery is subjected to a half charge or full charge, a half charge or a full discharge repeatedly one or more times. Then, an open circuit voltage (OCV) is measured for each SOC to check the degree of voltage drop of the secondary battery step by step to detect defective batteries. After this process, the shipping aging process for detecting the defect of the secondary battery is carried out before shipment.

The defect inspection period of the present invention can be set during the aging process, but it is preferable to proceed in the shipping aging process rather than the aging process in the activation process in order to determine the accurate low voltage level. It is because the low voltage defect may be expressed during the shipping aging period among those specified as good products as the defective products are not selected until the final step. That is, when the defect inspection section is set in the shipping aging process, there is an advantage that the defective battery can be efficiently selected.

On the other hand, in the steps (b) and (c), the open circuit voltage (OCV) is measured at the start and end points of the defect inspection section. At the start of the defect inspection section, Vs value, which is the OCV, is referenced, and at the end, Ve value, which is the OCV, and an advance-inputted discharge voltage profile are referenced, to thereby calculate the leakage current of the battery cell according to the present invention.

Preferably, the discharge voltage profile of the normal cell utilizes the measured full discharge voltage profile during the activation process of the battery cell determined to be normal beforehand. The method for detecting a low voltage expression level of a defective battery cell according to the present invention determines a discharge capacity value with reference to a discharge voltage profile of a normal cell under the assumption that a leakage current is constant in a defective inspection section, and derives a leakage current value according to time. Therefore, an accurate profile value of the normal cell, which can be used as a reference, is important. Therefore, it is desirable to use the measured full discharge voltage profile during the activation process of the normal cell, if possible.

In the step (d), a discharge capacity value corresponding to a voltage value equal to Vs and Ve in the discharge voltage profile is checked to obtain Cs and Ce values.

The Cd value, which is the discharge capacity difference (equal to the battery cell capacity change value) of the battery cell, is derived from the Cs and Ce values, which is shown in the following Equation 1:

$$C_d = C_s C_e \qquad \text{<Equation 1>}$$

(where Cd denotes a capacity change value of the battery cell, Cs denotes a battery cell capacity when equal to Vs in the step (b) in the discharge voltage profile of the normal cell, and Ce denotes a battery cell capacity when equal to Ve in the step (c) in the discharge voltage profile of the normal cell.)

The process of deriving Cd value will be described in detail with reference to a chart showing an example of the full-discharge voltage profile of the normal battery cell shown in FIGS. 2A and 2B. In FIG. 2B, when the Cs value is A, the Ce value is B, and the voltage drops from point A to point B as shown in the chart, the discharge capacity at two points A and B can be obtained, and the discharge capacity difference (mAh, the same as the battery cell capacity change value) Cd for this can be derived.

The leakage current of the battery cell is calculated by dividing the value by the time required for the defect inspection section, which can be expressed as Equation 2 as follows.

$$I_{leak} = C_d/T$$

(where $I_{leak}$ represents the leakage current of the battery cell, $C_d$ represents the capacity change value of the battery cell, and T represents the time required for the defect inspection section.)

The $I_{leak}$ value is calculated as a leakage current value due to self-discharge of the non-defective battery cell when the subject battery cell is a normal cell. On the other hand, when the subject battery cell is a defective cell in which a low voltage is expressed, the $I_{leak}$ value becomes a sum of a leakage current due to self-discharge and a leakage current due to an internal short circuit. Therefore, depending on whether the subject battery cell is a normal cell or a defective cell, the additional step is performed to calculate the leakage current due to the self-discharge and the internal short-circuit leakage current due to the precipitate.

According to the above-described method, the low voltage expression level of the battery cell can be indicated by a quantitative leakage current value unlike a conventional method which has presented only the change effects by steps by indicating the low voltage expression level by a voltage difference. As such, it is possible to quantitatively display the level of low-voltage expression by the magnitude of the leakage current value, and it is also possible to show a direct low-voltage expression level depending on the precipitate.

According to another embodiment of the present invention shown in FIG. 1B, when the subject battery cell is a battery cell determined to be defective, the step of calculating a precipitate leakage current according to Equation 3 may be further included, and it is possible to quantitatively analyze the precipitates due to the internal short circuit and the degree of the defect, unlike the conventional method.

The leakage current of a precipitate=the leakage current of a battery cell determined to be defective−the average leakage current of a normal cell  <Equation 3>

The average leakage current of the normal cell in Equation 3 may be calculated by adding a step of recording the leakage current value of the normal cell obtained in the step (e), and calculating an average of leakage currents of the normal cells accumulated in a large amount by recording. As described above, according to the present invention, in the low-voltage defective cell, since the leakage current due to the self-discharge in the leakage current of the defective cell can be quantitatively removed to calculate the leakage current of the precipitate, the level of low voltage expression can be more directly presented.

Further, a detection system for implementing a method of detecting a defective level according to the present invention includes a measuring unit 100, a storage unit 200, and a calculation unit 300. Herein, the measuring unit 100 includes a voltage measuring unit 110 of a battery cell for measuring a voltage at the start and end points of a defect inspection section and a consumption time measuring unit 120 of a defect inspection section. The storage unit stores a value inputted by the user in advance and includes a discharge voltage profile storage unit 210 of a normal cell, a defect determination result storage unit 220 of the normal cell, and a leakage current average value storage unit 230 of the normal cell.

The calculation unit 300 calculates the leakage current of the battery cell and the leakage current of the precipitate using the values of the measuring unit 100 and the storage unit 200. Specifically, the calculation unit 300 may include a leakage current calculation unit 310 of the battery cell and a precipitate leakage current calculation unit 320 of the battery cell. According to the result stored in the defect determination result storage unit 220, in the case of a normal cell, the value calculated by the leakage current calculation unit 310 may be directly recorded as a leakage current value due to the self-discharge of the non-defective battery cell, and in the case of a defective cell, it is possible to proceed to a step of calculating the precipitate leakage current.

While the present invention has been particularly shown and described with reference to exemplary embodiments thereof, it is to be understood that the invention is not to be limited to the details thereof, and it will be apparent to those skilled in the art that various modifications such as the above description, substitutions of components and the like, addition of additional components, and the like may be made without departing from the scope of the present invention based on the above description.

DESCRIPTION OF SYMBOLS

100: measuring unit
110: voltage measuring unit
120: consumption time measuring unit
200: storage unit
210: voltage profile storage unit
220: defect determination result storage unit
230: leakage current average value storage unit
300: calculation unit
310: battery cell leakage current calculation unit
320: precipitate leakage current calculation unit

The invention claimed is:

1. A method for detecting a low voltage defect expression level of a secondary battery by a process of inspection a defect of a battery cell of the secondary battery, the method comprising:
    (a) setting a defect inspection section in an aging process of the battery cell;
    (b) measuring an open circuit voltage (OCV) Vs of the battery cell at a start of the defect inspection section;
    (c) measuring an open circuit voltage (OCV) Ve of the battery cell at an end of the defect inspection section;
    (d) confirming battery cell capacities Cs and Ce at the Vs and Ve by using a discharge voltage profile of a normal cell; and
    (e) calculating a leakage current by using time required for the defect inspection section and a capacity change value Cd between Cs and Ce.

2. The method of claim 1, wherein the aging process of the step (a) is a shipment aging process.

3. The method of claim 1, wherein the discharging voltage profile of the normal cell in the step (d) is a full discharge voltage profile during an activation process of the normal battery cell.

4. The method of claim 1, wherein the Cd of the step (e) is derived by following Equation 1:

$$C_d = C_s - C_e$$

where Cd denotes a capacity change value of the battery cell, Cs denotes a battery cell capacity when equal to Vs in the step (b) in the discharge voltage profile of the normal cell, and Ce denotes a battery cell capacity when equal to Ve in the step (c) in the discharge voltage profile of the normal cell.

5. The method of claim 1, wherein the leakage current of the step (e) is derived by following Equation 2:

$$I_{leak} = C_d / T$$

wherein $I_{leak}$ represents the leakage current of the battery cell, $C_d$ represents the capacity change value of the battery cell, and T represents the time required for the defect inspection section.

6. The method of claim 1, further comprising:
    calculating a precipitate leakage current according to following Equation 3 if the battery cell is determined to be defective:

A leakage current of a precipitate=a leakage current of a battery cell determined to be defective−an average leakage current of a normal cell.

7. The method of claim 1, further comprising:
    recording the leakage current as a leakage current due to self-discharge of a non-defective battery cell if the battery cell is a normal cell.

8. A system for detecting a low voltage expression level of a secondary battery, the system comprising:
    a measuring unit, a storage unit, and a calculation unit,
    wherein the measuring unit includes a voltage measuring unit of a battery cell and a consumption time measuring unit of a defect inspection section,
    wherein the storage unit includes a discharge voltage profile storage unit of the normal cell, a defect determination result storage unit, and a leakage current average value storage unit of the normal cell, and
    wherein the calculation unit includes a leakage current calculation unit of the battery cell, and a precipitate leakage current calculation unit.

9. The system of claim 8, wherein the defect determination result storage unit stores a result of determining whether the battery cell is normal or defective.

* * * * *